United States Patent
Ogomi et al.

(10) Patent No.: US 9,396,366 B2
(45) Date of Patent: Jul. 19, 2016

(54) MAGNETIC SENSOR DEVICE

(71) Applicant: Mitsubishi Electric Corporation, Chiyoda-ku (JP)

(72) Inventors: Tomokazu Ogomi, Chiyoda-ku (JP); Hironobu Arimoto, Chiyoda-ku (JP); Satoshi Yamanaka, Chiyoda-ku (JP); Kazuya Makabe, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/440,941

(22) PCT Filed: Nov. 6, 2013

(86) PCT No.: PCT/JP2013/080021
§ 371 (c)(1),
(2) Date: May 6, 2015

(87) PCT Pub. No.: WO2014/077163
PCT Pub. Date: May 22, 2014

(65) Prior Publication Data
US 2015/0261981 A1 Sep. 17, 2015

(30) Foreign Application Priority Data
Nov. 15, 2012 (JP) ................................. 2012-250933

(51) Int. Cl.
*G06K 7/08* (2006.01)
*G01R 33/00* (2006.01)
*G01R 33/10* (2006.01)

(52) U.S. Cl.
CPC ............ *G06K 7/088* (2013.01); *G01R 33/0094* (2013.01); *G01R 33/10* (2013.01); *G06K 7/087* (2013.01)

(58) Field of Classification Search
CPC ... G06K 7/088; G06K 7/087; G01R 33/0094; G01R 33/10
USPC .......................................... 235/449, 474, 435
See application file for complete search history.

(56) References Cited

U.S. PATENT DOCUMENTS 6,611,142 B1 * 8/2003 Jones .................... G01R 33/10
324/205

(Continued)

FOREIGN PATENT DOCUMENTS

JP 2012-47685 A 3/2012
WO WO 2012/014546 A1 2/2012

OTHER PUBLICATIONS

International Search Report issued Jan. 28, 2014, in PCT/JP2013/080021, filed Nov. 6, 2013.

*Primary Examiner* — Paultep Savusdiphol
(74) *Attorney, Agent, or Firm* — Oblon, McClelland, Maier & Neustadt, L.L.P.

(57) ABSTRACT

A magnetic sensor device includes magnetic detection elements arrayed along a line intersecting the relative movement direction of a medium, and a magnet applying a bias magnetic field to the magnetic detection elements with a line of magnetic force in the constant direction. The magnetic sensor device detects a magnetic field change when a medium with a magnetic pattern passes through the bias magnetic field as an electric signal through the magnetic detection elements and reads the magnetic pattern of the medium. A plurality of reading switches is connected to the respective magnetic detection elements and an output line common to the magnetic detection elements. The magnetic sensor device includes a shift register closing the reading switches sequentially one by one to transfer the outputs from the magnetic detection elements sequentially one by one to the output line.

13 Claims, 18 Drawing Sheets

(56) References Cited

U.S. PATENT DOCUMENTS

| | | | |
|---|---|---|---|
| 2004/0104269 A1* | 6/2004 | Bisson | G06K 7/084 235/449 |
| 2005/0023348 A1* | 2/2005 | Lucas | G06K 7/0004 235/440 |
| 2008/0128489 A1* | 6/2008 | Beskitt | G07D 7/04 235/379 |
| 2013/0127457 A1* | 5/2013 | Musha | B82Y 25/00 324/252 |
| 2015/0115031 A1* | 4/2015 | Hoson | G06K 13/0868 235/449 |

* cited by examiner

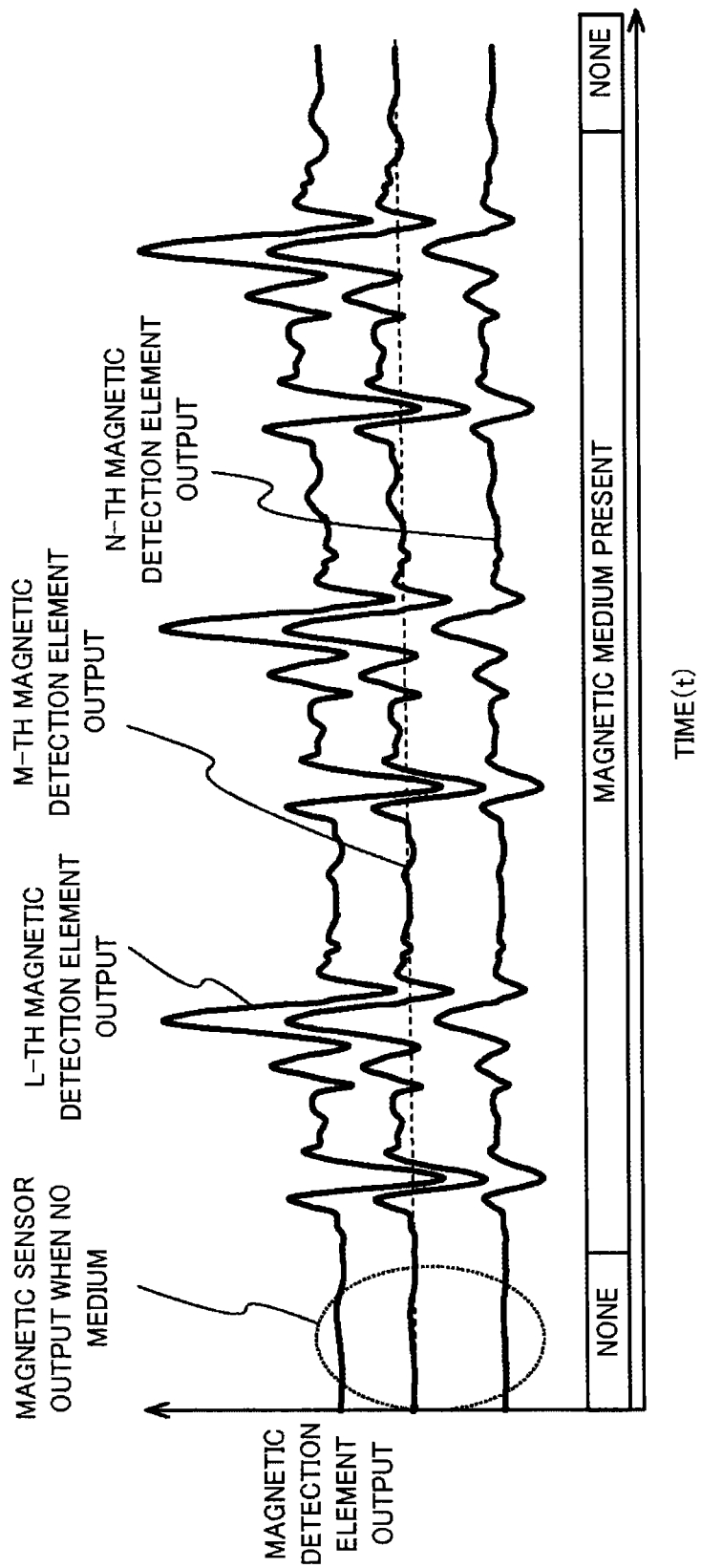

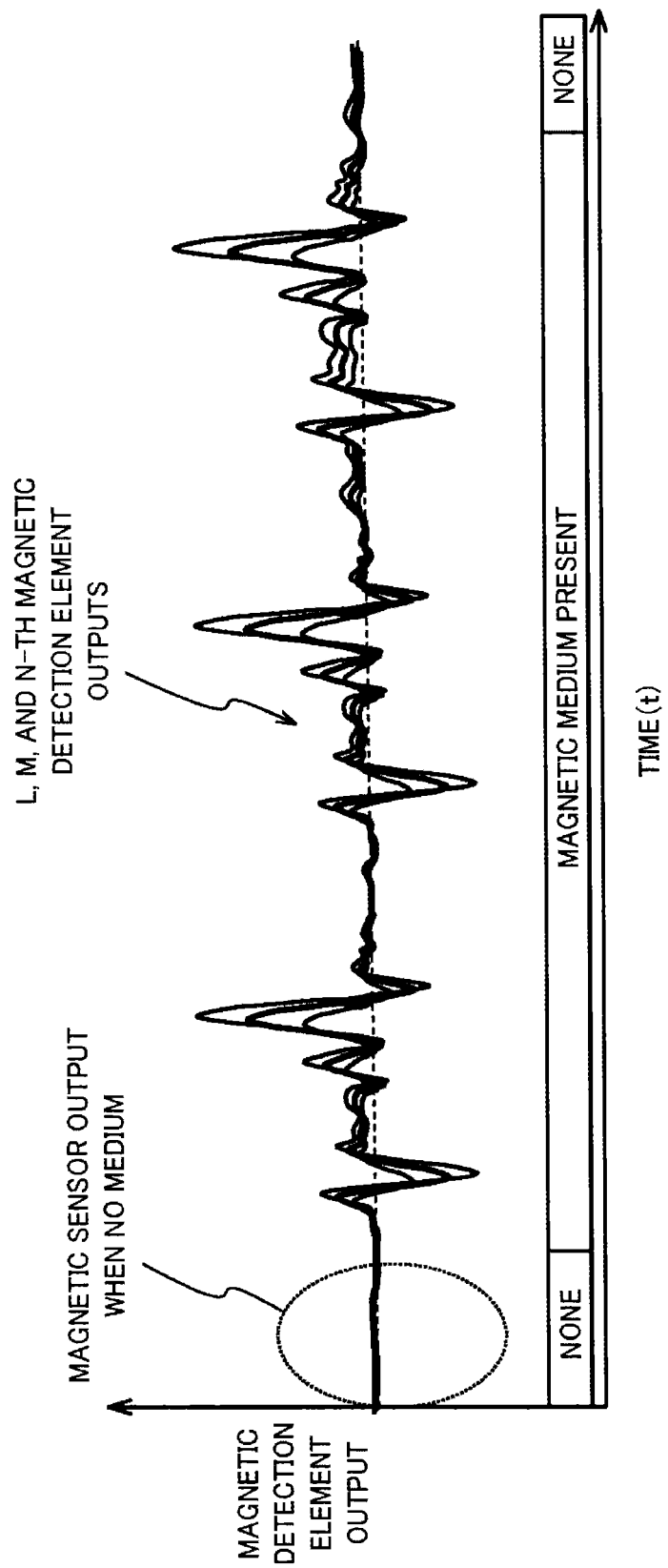

FIG. 15A
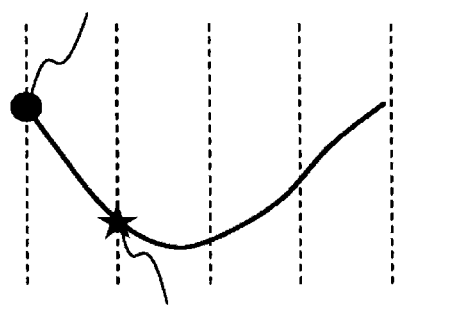
FIG. 15B
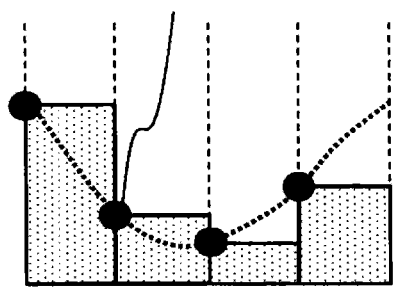 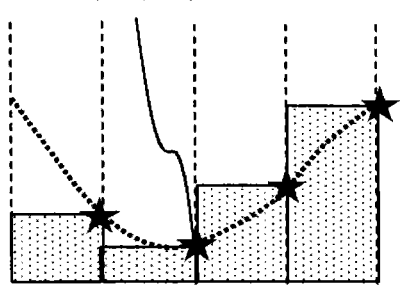

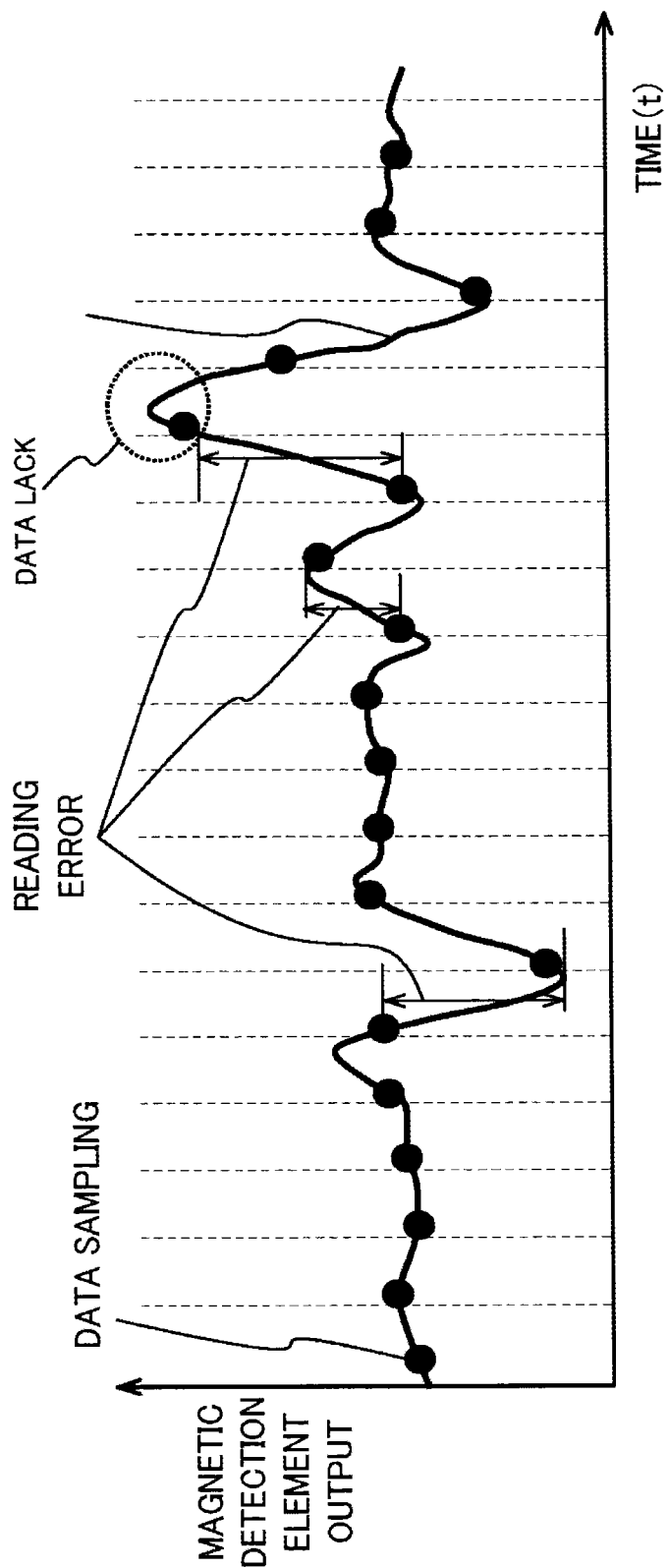

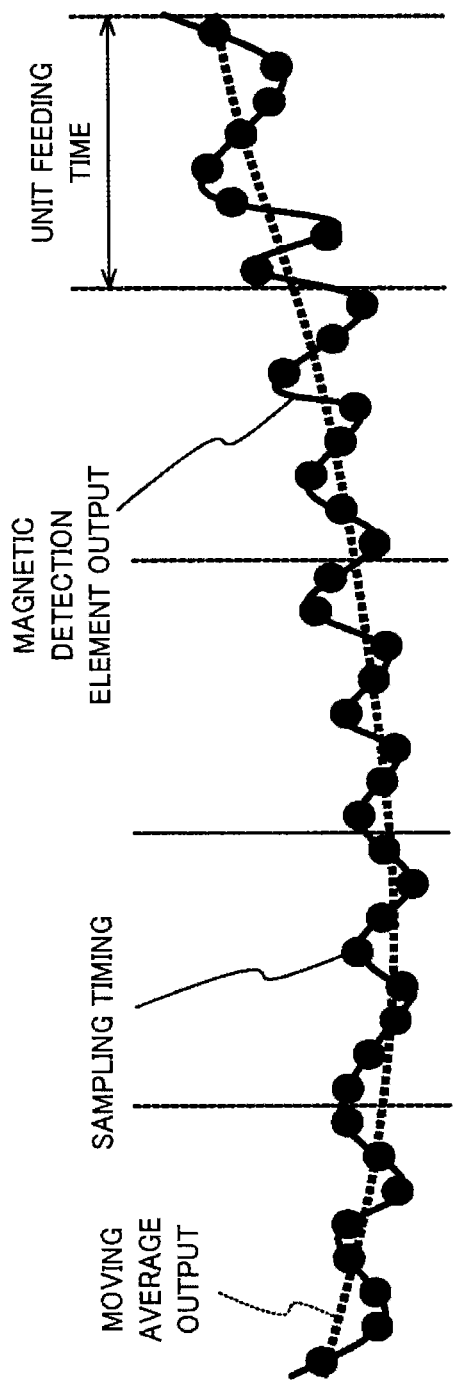

MAGNETIC SENSOR DEVICE

TECHNICAL FIELD

The present disclosure relates to a magnetic sensor device that detects magnetic patterns on a medium, such as a magnetic-ink printed material, a magnetic recording medium, or a magnetic slit scale.

BACKGROUND ART

Magnetic sensor devices are utilized to, for example, convert patterns printed with magnetic inks that are applied on a medium requiring a high-level security, such as a paper bill or a personalized check, into electronic information, and to determine the authenticity of the medium based on such information. In the case of devices like automatic vending machines and ticket vending machines which handle a small amount of money and therefore are required to be low in cost, two to five magnetic detection elements like Hall elements are used in a magnetic-pattern reading unit to detect magnetic information on multiple stripe-shape lines in the feeding direction of the medium (paper bill), thereby detecting the medium, determining the kind, and examining the authenticity. According to such magnetic sensor devices, since only specific locations of the magnetic patterns are readable, when the kind of the target medium (magnetic pattern to be determined) changes, it is required to change the reading unit.

Conversely, in the case of magnetic sensor devices applied to bill returning type ATMs (Automated Teller Machines), business-purpose bill counters or bill sorters which require a high-level bill authenticity examination, a large number of magnetic detection elements over the whole width of a paper bill or a personal check are disposed in a bill processing unit, and thus more pieces of magnetic information can be utilized for the determination and authenticity examination.

Patent Literature 1 discloses a magnetic body detection device that includes, for example, a magnetic resistance sensor disposed at the middle of the moving route of a magnetic body, a lower magnet which has the S and N polarities oriented along the movement direction of the magnetic body, and an upper magnet which has the N and S polarities oriented along the movement direction of the magnetic body. The lower magnet and the upper magnet are disposed so as to have, via the moving route of the magnetic body therebetween, the S polarity of the lower magnet and the N polarity of the upper magnet facing with each other, and have the N polarity of the lower magnet and the S polarity of the upper magnet facing with each other.

According to the magnetic image sensor disclosed in Patent Literature 1, multiple magnetic resistance sensors are disposed linearly. Output signals by the respective magnetic resistance sensors are supplied to the processing circuit simultaneously or time sequentially, and are stored in the processing circuit as one-dimensional image signals. Such a reading operation is performed every time the magnetic body moves by a predetermined pitch, thereby obtaining a two-dimensional magnetic pattern image.

Patent Literature 1 discloses that the output signals from the multiple magnetic resistance sensors are converted into digital values through an A-D converter to execute a signal processing. In this case, since the sampling is performed on the output signals, the resultant information is discrete in time.

CITATION LIST

Patent Literature

Patent Literature 1: International Publication No. WO 2012/014546

SUMMARY OF INVENTION

Technical Problem

The magnetic sensor device performs, magnetic detection by magnetic detection element, a reading operation through an individual reading circuit configured as an analog circuit. Hence, successive magnetic signal outputs in the feeding direction are obtained. Although a high-resolution reading is possible in the feeding direction, the pitch between the adjacent magnetic detection elements in the reading width direction is substantially 10 mm. Hence, the resolution in the width direction is not high in comparison with magnetic patterns printed on a medium.

Magnetic sensor devices which have a higher resolution in the reading width direction have been proposed, but the reading speed is slow and does not satisfy the feeding speed requirement, demanded for actual devices, of a medium, such as, a paper bills. In addition, the magnetic sensors of such devices also output analog information through the output from each magnetic detection element. Accordingly, it is required to use an analog circuit that is designed to process the outputs from the magnetic detection elements. In order to enhance the resolution of the magnetic sensor devices, it is required to prepare analog circuits as many as magnetic detection elements, this prevents the improvement of the resolution of the magnetic pattern detection.

The present disclosure has been made in order to solve the aforementioned technical problems, and it is an objective of the present disclosure to simplify a reading circuit for output signals from a plurality of magnetic detection elements, and to enhance a reading resolution of a magnetic pattern.

Solution to Problem

A magnetic sensor device according to the present disclosure includes a magnetic detection element, and a biasing magnet that applies a bias magnetic field to the magnetic detection element with a line of magnetic force in a constant direction. The magnetic sensor device detects, through the magnetic detection element as an electric signal, a magnetic field change when a medium including a magnetic pattern passes through the bias magnetic field, and reads the magnetic pattern of the medium. The magnetic sensor device includes a plurality of the magnetic detection elements that are arrayed along a reading line intersecting with a relative movement direction of the medium. A plurality of switches are each connected to the respective magnetic detection element of the plurality of the magnetic detection elements and to a output line common to the plurality of magnetic detection elements. In addition, a switch controller closes the switches sequentially one by one to transfer respective outputs from the magnetic detection elements sequentially one by one to the output line. The switch controller carries out the reading cycle in synchronization with the relative movement of the medium and at a frequency of a unit feeding time that is a time period at which a relative movement distance of the medium becomes equal to a pitch of the adjacent magnetic detection elements along the reading line, the reading cycle being an operation of transferring the outputs of all magnetic detection elements of the plurality of magnetic detection elements one by one to the output line common to the plurality of the magnetic detection elements.

Advantageous Effects of Invention

According to the magnetic sensor device of the present disclosure, the outputs from the plurality of magnetic detection elements arrayed along the reading line are transferred sequentially to the common output line. Hence, it enables to simplify of a reading circuit for output signals from the plurality of magnetic detection elements, and to enhance a reading resolution of a magnetic pattern.

BRIEF DESCRIPTION OF DRAWINGS

FIG. 5 is an exemplary diagram illustrating an output from a magnetic detection element;

FIG. 6 is an exemplary diagram illustrating an output from the magnetic detection element after being adjusted its offset;

FIG. 15A is a diagram illustrating an output position of the first element in a line and that of the last element in the line;

FIG. 15B is a diagram illustrating an error caused by a difference in output timing;

FIG. 16 is a diagram illustrating an error in sampling on the output from the magnetic detection element;

FIG. 19B is an enlarged diagram of a part encircled by a dotted-line ellipse in FIG. 19A;

DESCRIPTION OF EMBODIMENTS

Figure 1:
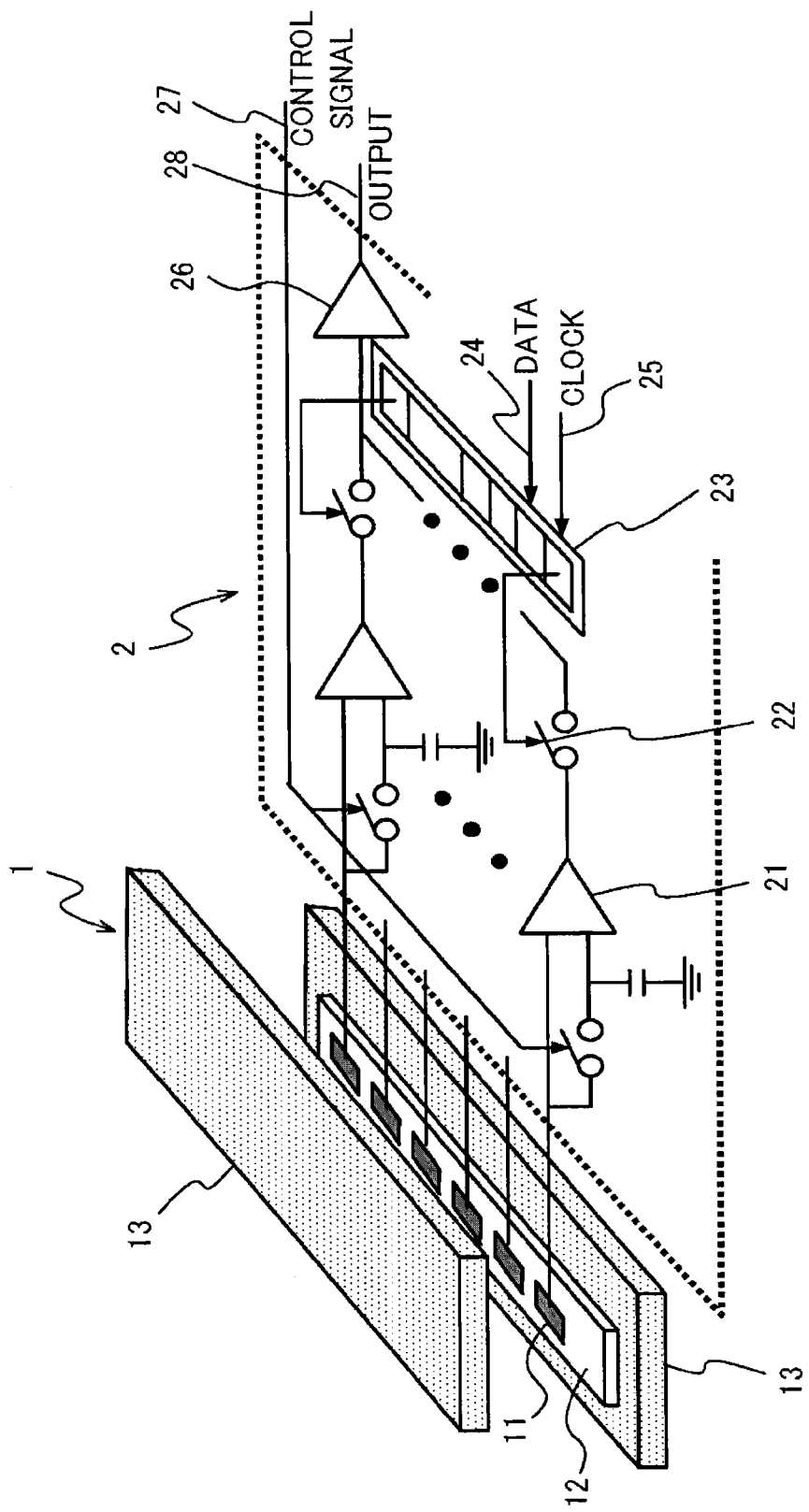
FIG. 1 is a conceptual diagram of a magnetic sensor device according to an embodiment of the present disclosure.

Embodiments of the present disclosure are explained below in detail with reference to the drawings. The same or corresponding part is denoted by the same reference numeral throughout the drawings.

Embodiment 1

FIG. 1 is a conceptual diagram of a magnetic sensor device according to an embodiment of the present disclosure. The magnetic sensor device of this embodiment includes a magnetic detection module 1 and a signal reading circuit 2. The magnetic detection module 1 includes a substrate 12 on which a plurality of magnetic detection elements 11 is mounted, and magnets 13.

The magnetic detection elements 11 are arranged along a reading line intersecting with the feeding direction (relative movement direction) of a medium that includes magnetic patterns. The magnetic detection elements 11 are each, for example, Semiconductor Magnetic Resistor (SMR) elements. The magnetic detection elements 11 are arrayed on the substrate 12, for example, linearly over the width of 200 mm at a constant pitch of 0.5 mm. In this case, the number of magnetic detection elements 11 is 400.

The substrate 12 is disposed between the two magnets 13. The magnets 13 are each disposed so as to apply lines of magnetic force in the constant direction to the magnetic detection elements 11, and thus magnetic fields having a constant intensity are constantly applied to the magnetic detection elements 11. The direction in which the semiconductor magnetic resistor elements sense the magnetic fields is a vertical direction to the detection plane of the element, and in this case, bias magnetic fields are applied to the detection planes of the elements in the vertical direction thereto. In FIG. 1, the two magnets 13 form substantially uniform magnetic fields in the array direction of the magnetic detection elements 11.

The substrate 12 is formed with wiring patterns and electrodes to apply bias voltages to the respective magnetic detection elements 11, and wiring patterns and electrodes to connect the magnetic detection elements 11 with an output circuit. The signal reading circuit 2 that includes semiconductor circuits for reading the outputs by the respective magnetic detection elements 11 on the substrate 12 is connected to the substrate 12. The substrate 12 and the signal reading circuit 2 are connected together through the electrodes of the substrate 12 via, for example, Au wires or Al wires. In addition, a power source line for a reference bias voltage is connected to a bias electrode of the substrate 12.

In the signal reading circuit 2, the outputs from the respective magnetic detection elements 11 are connected to respective reading switches 22 through respective individual reading circuits 21 each including a gate and an amplifier. Each magnetic detection element 11 outputs a signal that oscillates in positive and negative values with reference to a predetermined offset voltage. A variation in offset voltage of individual magnetic detection element 11 and a temperature fluctuation are detected within a blank period at which no magnetic pattern is present at the position of the reading line, for example, a time period in which no medium such as a paper bill is present in the magnetic detection module 11, and the detected variation and temperature fluctuation level are stored. When the magnetic patterns are present at the reading positions, and signals are read, the individual reading circuit 21 corrects the signal with the individual variation in the offset voltage and temperature fluctuation, and performs a predetermined amplification.

The reading switch 22 is provided for each magnetic detection element 11, and is connected to the magnetic detection element 11 through the individual reading circuit 21. The other end of the reading switch 22 is connected to an output line 28 through a common amplifier circuit 26 common to the magnetic detection elements 11.

Each reading switch 22 has the ON/OFF state controlled in accordance with a corresponding bit condition of data in a shift register 23. Through a data line 24, data in that a corresponding bit to a reading switch 22 is such value to turn ON the reading switch 22 and other bits are such value to turn OFF switches is set to the shift register 23. When a clock is applied to the shift register 23 through a clock line 25, data is shifted to an adjacent bit in one direction. The circuit is constructed in such a way that, upon bit shifting, for example, data shifted from the last-end bit is input to the first bit (that is, data is circulated in the shift register 23). Every time the clock is applied, the data is shifted to the adjacent bit, and thus the reading switches 22 are turned ON sequentially one by one from the first end to the last-end. Therefore, the output from only one magnetic detection element 11 having the corresponding reading switch 22 turned ON is input to the common amplifier circuit 26.

A reading cycle is defined as an operation of transferring the outputs of all magnetic detection elements 11 one by one to the common output line 28 among the magnetic detection elements 11. During the reading cycle, ON control signals 27 each are set to connect the outputs of the respective magnetic detection elements 11 to respective individual reading circuits 21. Next, data that turns ON a reading switch 22 is circulated in the shift register 23, thereby carrying out the reading cycle. The shift register 23 is an example of a switch controller. The way of carrying out the reading cycle is not limited to the method utilizing the above-explained shift register 23.

Figure 2:
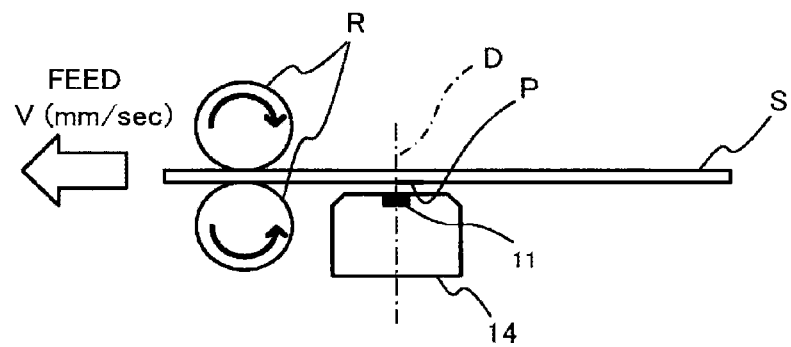
FIG. 2 is a conceptual diagram of a medium feeding by the magnetic sensor device.

FIG. 2 is a conceptual diagram of a medium feeding by the magnetic sensor device. In FIG. 2, the substrate 12 and the lower magnet 13 are illustrated collectively as a magnetic sensor unit 14. A medium S subjected to magnetic-information reading is fed by feeding rollers R, and the medium S passes through reading line D of the magnetic detection elements 11 at a feeding speed V (mm/sec). The medium S subjected to the magnetic-information reading by the magnetic sensor device 10 is, for example, a paper bill, a personal check, or other valuable security that has a magnetic pattern P which is a predetermined pattern printed with magnetic inks. The medium S is fed between the upper magnet 13 and the substrate 12 in FIG. 1 in the direction intersecting with the array direction of the magnetic detection elements 11, for example, the orthogonal direction to the array direction. By repeating and carrying out the reading cycle concurrently with the feeding of the medium S, for each reading cycle, the output from the magnetic detection element 11 depending on the magnetic pattern P arrived at the reading line D is transferred sequentially one by one to the output line 28 over the magnetic detection elements 11.

An operation of transferring the outputs of the magnetic detection elements 11 along the reading line D is called a main scanning. In addition, an operation of repeating the reading cycle while feeding (relative movement) the medium S is called a sub scanning. According to the magnetic sensor device 10, the outputs from the magnetic detection elements 11 in the main scanning appear on the single output line 28 in a sequential order, and the outputs in the main scanning appear repeatedly on the single output line 28 in a sequential order for each reading cycle. In this way, two-dimensional information on the magnetic pattern P on the medium S can be obtained as signals in a sequential order through the single output line 28.

Figure 3:
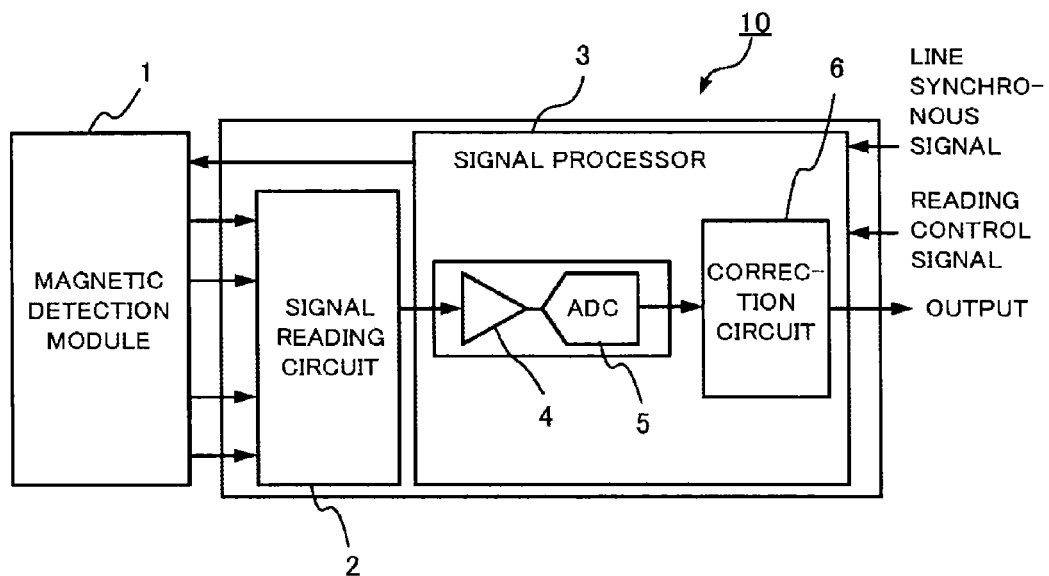
FIG. 3 is a block diagram illustrating an example configuration of the magnetic sensor device according to Embodiment 1.

FIG. 3 is a block diagram illustrating an example configuration of the magnetic sensor device according to Embodiment 1. Signals representing the magnetic information and output to the common signal line to the magnetic detection elements 11 from the signal reading circuit 2 are sent to a common signal processor 3. In the signal processor 3, in order to obtain the optimized signal dynamic range for the processes in a following stage, an offset amplifier circuit 4 amplifies again the signals and adds an offset voltage thereto.

In addition, the signals processed with the common analog process are sent to an analog-digital converter (hereinafter, referred to as an ADC) 5 that digitalizes analog signals, and are converted into digital signals. The outputs from the magnetic detection elements 11 converted into the digital signals are output to the output line 28 as output signals after being corrected the offset and the like by a correction circuit 6.

Figure 4:
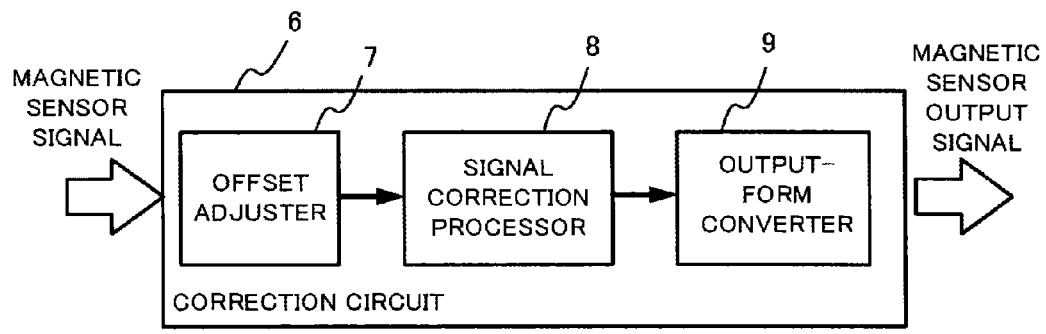
FIG. 4 is a block diagram illustrating an example configuration of a correction circuit according to Embodiment 1.

FIG. 4 is a block diagram illustrating an example configuration of the correction circuit according to Embodiment 1. The correction circuit 6 includes an offset adjuster 7, a signal correction processor 8, and an output-form converter 9.

The magnetic information signals digitalized by the ADC 5 at this stage are signals having an offset voltage added by the analog circuits of the preceding stage, but as illustrated in FIG. 5, it is uncertain what value the output value becomes at a portion without the magnetic information. Hence, a correction is performed with reference to a signal portion in the blank period that is a period without the magnetic pattern.

The output value of the time period without the magnetic signal is determined by referring to the signal indicating the blank period of the reading medium (signal indicating a break between media or reading area signal of the medium). A change from the output value in this blank period is recognized as a magnetic information signal, and a process of adjusting the midpoint of the dynamic range of the digital signal in the magnetic information signal to be a uniform offset throughout all magnetic detection elements 11 is performed. For example, as illustrated in FIG. 6, when the dynamic range of the digital output is represented in 255 gradations, the reference for the magnetic information signal is always the midpoint (128) of the digital output value. Since the magnetic detection elements 11 have consistent references for the signals output therefrom, the subsequent signal processing and determination are facilitated.

The magnetic information signals processed as explained above are further sent to a signal processor 3 in a following stage. In the signal correction processor 8, a magnetic medium used as a reference is read beforehand, and the magnetic detection sensitivity that differs from one by one is corrected through the correction circuit 6 that stores the output from each magnetic detection element 11 so as to make the magnetic detection elements 11 output the same value when the reference magnetic medium is read. This correction process can be carried out when it is necessary.

The output-form converter 9 adds signals representing the data output time period of the magnetic information, a synchronous clock, and the break of the detection lines to the magnetic information signals output from the signal correction processor 8, and outputs the processed signals as an output from the magnetic sensor.

Figure 7A:
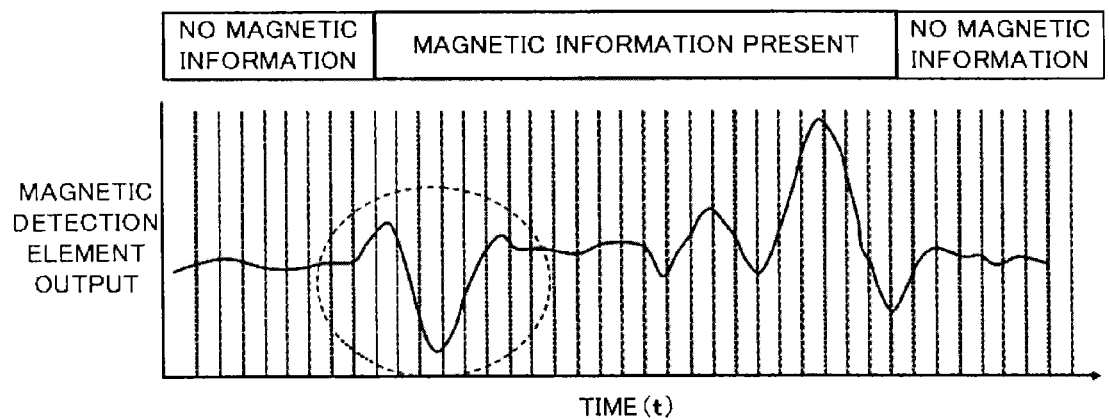
FIG. 7A is a diagram illustrating an example output from the magnetic detection element.
Figure 7B:
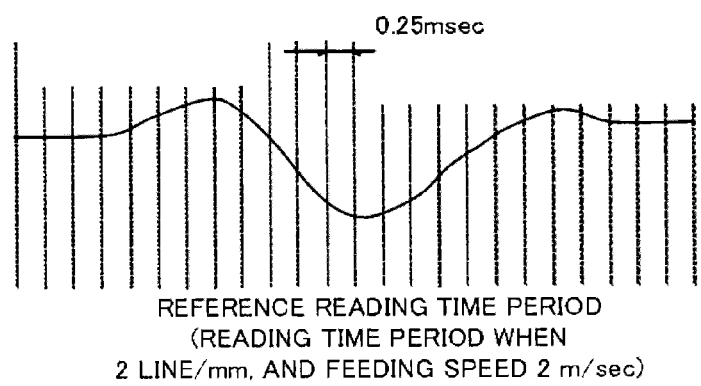
FIG. 7B is an enlarged view of a part encircled by a dotted-line ellipse in FIG. 7A.

FIG. 7A is a diagram illustrating an example output from the magnetic detection element. FIG. 7A illustrates an output from the magnetic detection element 11 containing a portion without the magnetic information. FIG. 7B is an enlarged view of a part encircled by a dotted-line ellipse in FIG. 7A. The output from the single magnetic detection element 11 changes with time as illustrated in FIG. 7A in accordance with the feeding of the medium as illustrated in FIG. 3. When the output from the magnetic detection element 11 is read in synchronization with the feeding (relative moving distance) of the medium, a magnetic pattern on a predetermined line of the medium along the sub-scanning line can be read. When the medium is fed in a constant speed, by carrying out the reading at a constant cycle, the magnetic pattern on the sub scanning line can be read at the equal intervals.

The outputs from the magnetic detection elements 11 appear serially on the common output line 28 through the switches of the signal reading circuit 2, and when the data on the common output line 28 is sampled in synchronization with the clock to be applied to the shift register 23, the outputs from the magnetic detection elements 11 can be read as serial data in a sequential order. The output from the single magnetic detection element 11 can be obtained by collecting sampling data in accordance with a cycle (reading cycle) of circulating data in the shift register 23.

When, for example, the feeding speed of the medium is 2 msec, and the pitch of the sub scanning is 2 line/mm that is equal to the pitch between the magnetic detection elements 11 which is 0.5 mm, a reading time per a line (a reading cycle) becomes 0.25 msec.

Figure 8A:
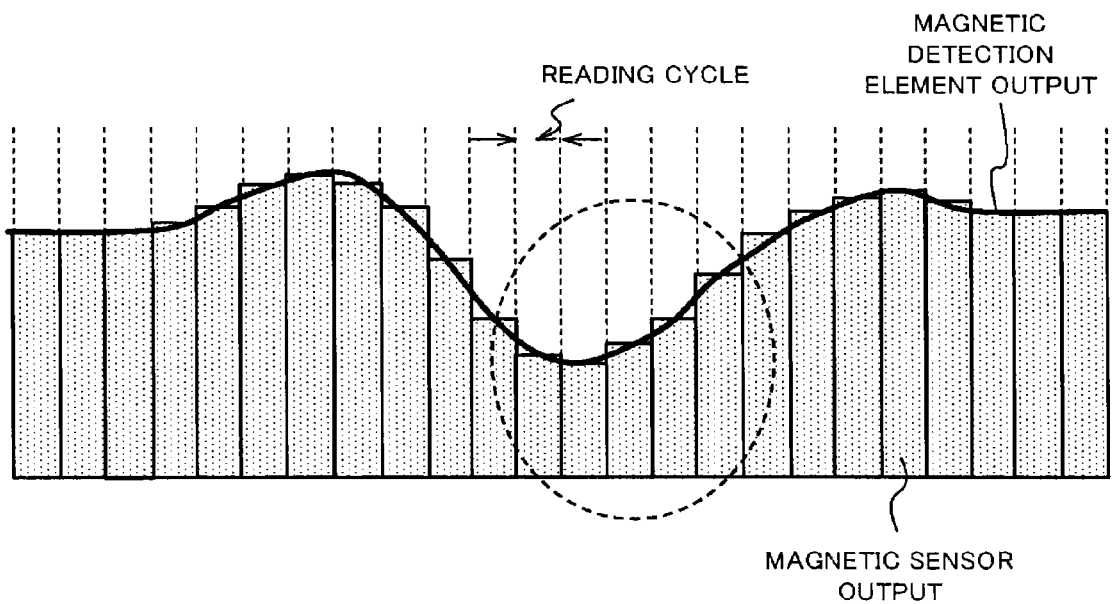
FIG. 8A is a diagram illustrating an example sampling performed on an output from the magnetic detection element.
Figure 8B:
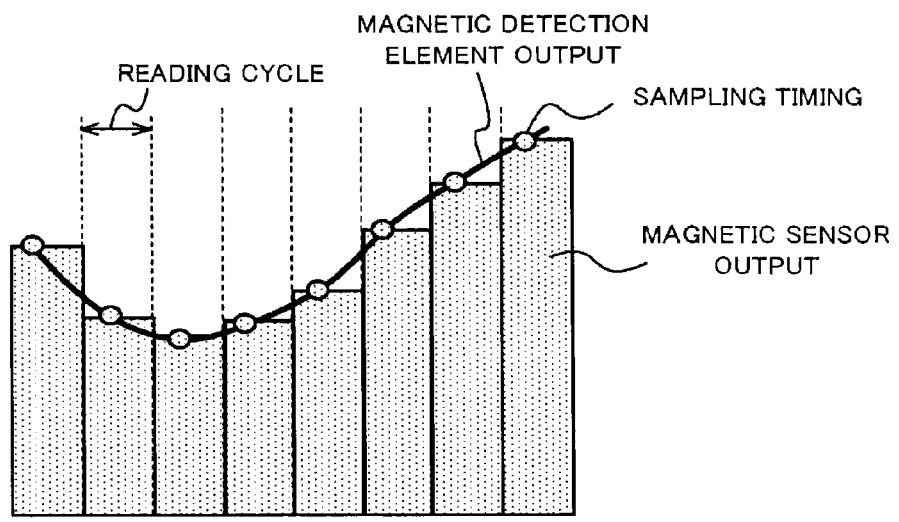
FIG. 8B is an enlarged view illustrating a part encircled by a dotted-line ellipse in FIG. 8A.

FIG. 8A is a diagram illustrating an example sampling performed on the output from the magnetic detection element. FIG. 8A illustrates the range in FIG. 7B. FIG. 8B is an enlarged view of a part encircled by a dotted-line ellipse in FIG. 8A. FIG. 8A illustrates the output from the single magnetic detection element 11. The output from the single magnetic detection element 11 appears on the common output line 28 only during a time at which the switch is turned ON in the reading cycle. In the other remaining times, respective outputs from the other magnetic detection elements 11 appear sequentially on the common output line 28. The output from each magnetic detection element 11 is sampled at a timing assigned to the magnetic detection element 11 in the interval of the reading cycle (during a time at which the switch is turned ON). The value at this sampling timing is output as an output value (magnetic sensor output) of the magnetic detection element 11 in this reading cycle.

Figure 9:
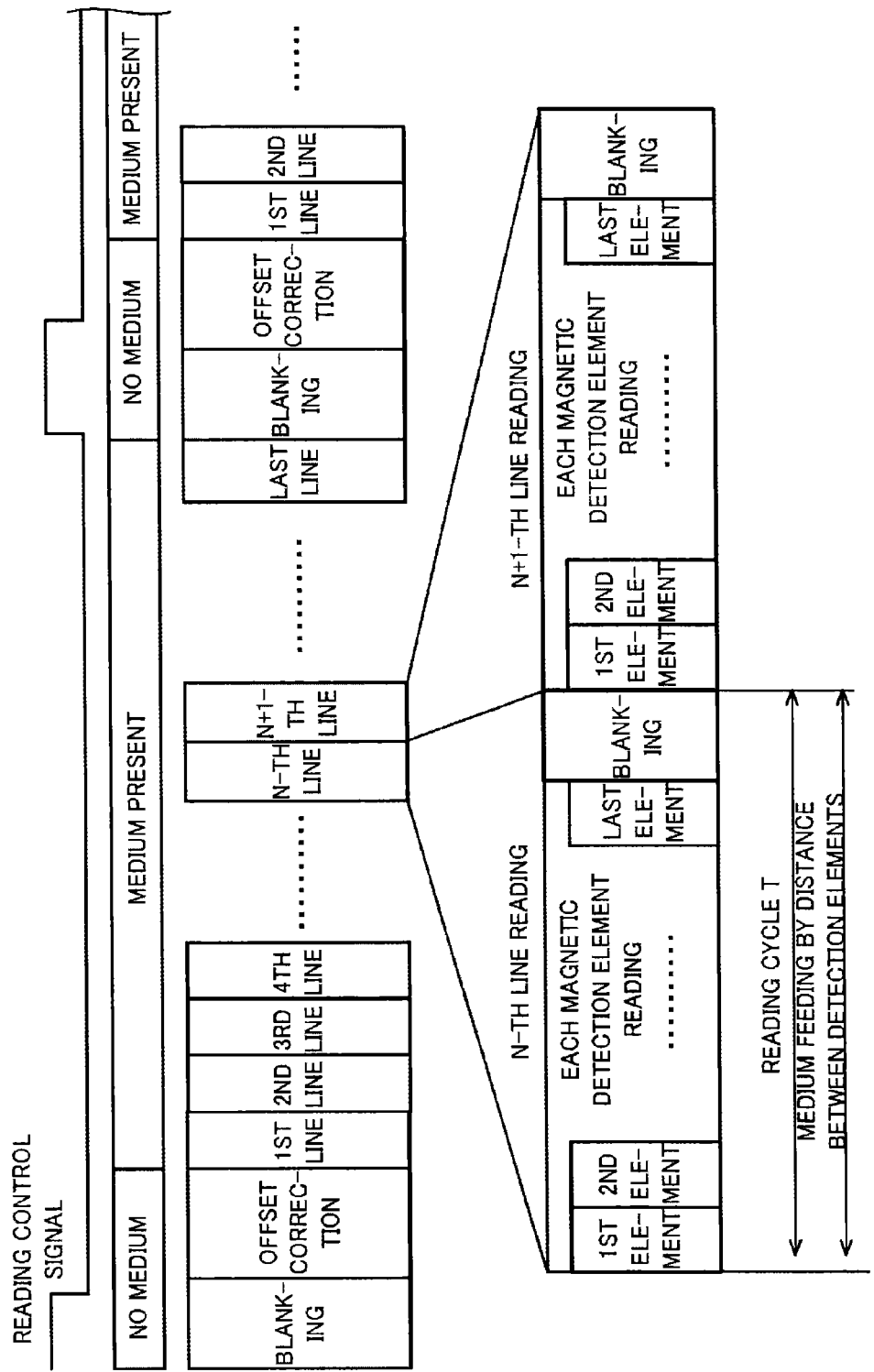
FIG. 9 is a diagram illustrating a reading sequence of magnetic patterns according to Embodiment 1.

FIG. 9 is a diagram illustrating a reading sequence of magnetic patterns according to Embodiment 1. As to the magnetic pattern information on the whole medium subjected to the reading, information from the magnetic detection elements 11 can be obtained as two-dimensional image information by repeating the reading operation as illustrated in FIG. 9.

The magnetic sensor device 10 of Embodiment 1 is configured to perform sampling (reading cycle) in the main scanning direction of the magnetic detection elements 11 and to repeat the main scanning (reading cycle) in the sub scanning direction in synchronization with the feeding of the medium. Therefore, the compatibility of data format with the line image sensor that reads optical information can be easily accomplished. Hence, it becomes possible for the magnetic sensor device to likewise process magnetic information and optical information.

Embodiment 2

Figure 10:
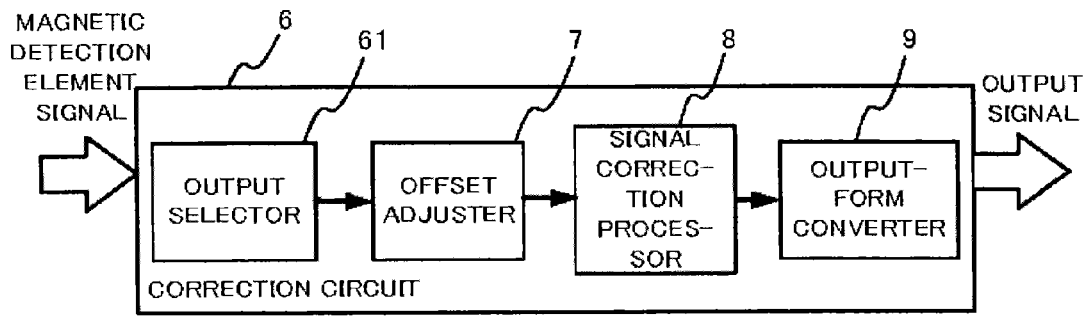
FIG. 10 is a block diagram illustrating an example configuration of a correction circuit according to Embodiment 2 of the present disclosure.

According to Embodiment 2, in addition to Embodiment 1, the noise components in the output from the magnetic detection element 11 are reduced. FIG. 10 is a block diagram illustrating an example configuration of a correction circuit according to Embodiment 2 of the present disclosure. A correction circuit 6 of Embodiment 2 includes, in addition to the configuration of Embodiment 1, an output selector 61.

The output selector 61 stores, for each magnetic detection element 11, the output value of the previous reading cycle. When the output is within a threshold range determined from the output value of the previous reading cycle, the same output value as that of the previous reading cycle is output as the output value of the current reading cycle. In this case, the stored output of the previous reading cycle is not updated. When the output is outside of the threshold range determined from the output value of the previous reading cycle, the output of this reading cycle is output as the current output value, and the output value of the previous reading cycle is updated with the output value of the current reading cycle.

Figure 11:
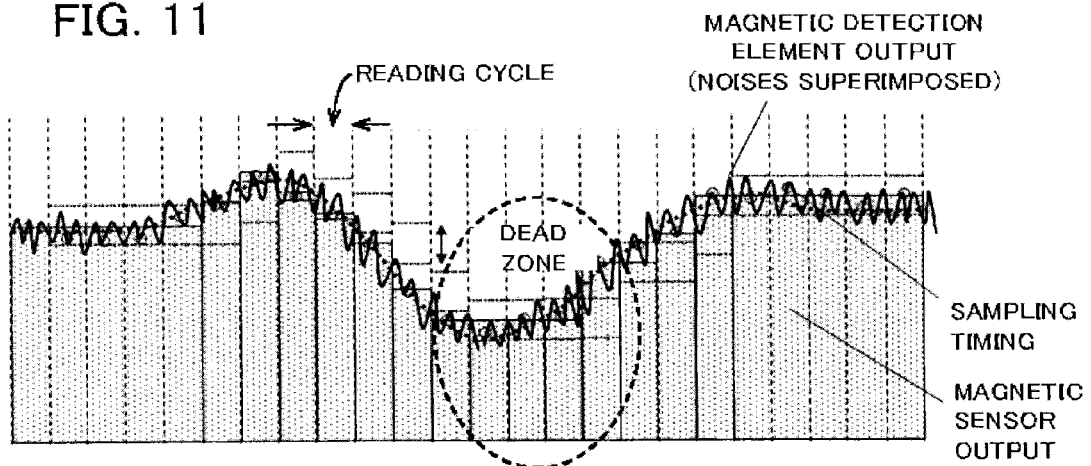
FIG. 11 is a diagram illustrating an example dead zone according to Embodiment 2.

FIG. 11 is a diagram illustrating an example dead zone according to Embodiment 2. As is indicated by the output from the magnetic detection element in FIG. 11, the actual output from each magnetic detection element 11 contains noise components. In order to reduce the noise components, according to Embodiment 2, a predetermined dead zone is set based on the output of the previous reading cycle. In FIG. 11, the output of the previous reading cycle is set as a center and upper and lower value ranges around the center are set as the dead zone.

Figure 12:
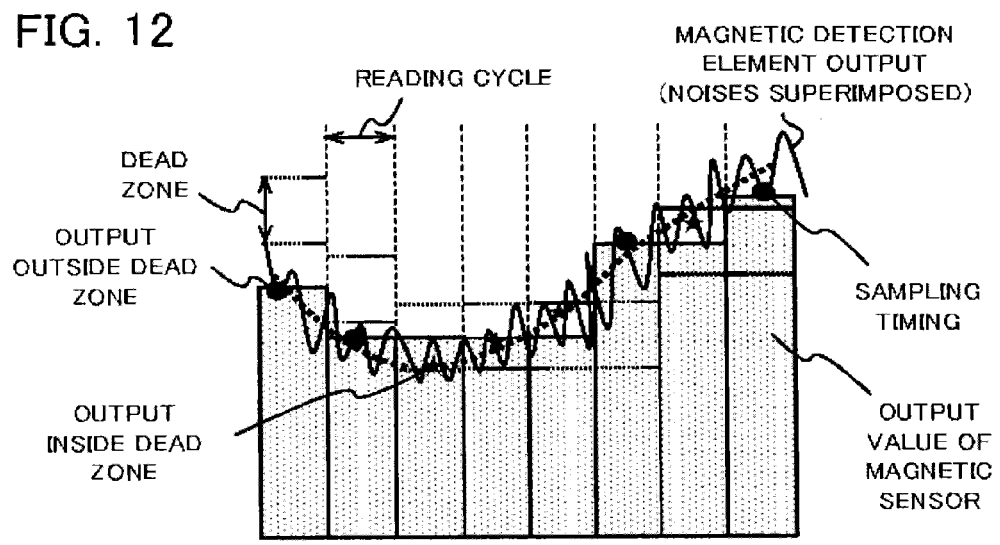
FIG. 12 is a diagram illustrating an example output selection of the magnetic detection element according to Embodiment 2.

FIG. 12 is a diagram illustrating an example output selection of the magnetic detection element according to Embodiment 2. FIG. 12 is a diagram enlarged view of the region surrounded by a dotted line in FIG. 11. The dead zone is indicated by a horizontal dotted line. When the output of the current reading cycle is outside of the dead zone determined from the output of the previous reading cycle, the value at the sampling timing is indicated by a black dot. When the output of the current reading cycle is within the dead zone of the output of the previous reading cycle, the value at the sampling timing is indicated by a star. The output by the magnetic sensor is represented by the height indicated with a solid line passing through the black dots.

Magnetic image information having reduced noise components can be obtained in this way, and thus a further precise magnetic information determination is enabled. The output selector 61 may be provided in front of, not the offset adjuster 7, but the signal correction processor 8 or the output-form converter 9.

The magnetic sensor device 10 of this embodiment has, for example, the magnetic detection elements 11 arrayed at the pitch of 0.5 mm over the detection width of 200 mm, thus including 400 magnetic detection elements 11. Provided that the pitch between the magnetic detection elements 11 is equal to the detection pitch in the feeding direction of the medium feeding, that the detection period per a reading cycle is set to 0.25 msec, and that the medium feeding speed becomes 2 msec, magnetic information can be detected at a remarkably fast-speed. The data output clock in this case is substantially 2 MHz, a connection with a bill authenticity examination system can be established easily.

In this embodiment, the effective reading width of the medium is set to 200 mm, but the effective reading width can be changed to arbitrary length. For example, assuming that the shorter side of a paper bill is oriented in the array direction (main scanning direction) of the magnetic detection elements 11, the effective reading width can be set to substantially 100 mm or smaller.

Figure 13:
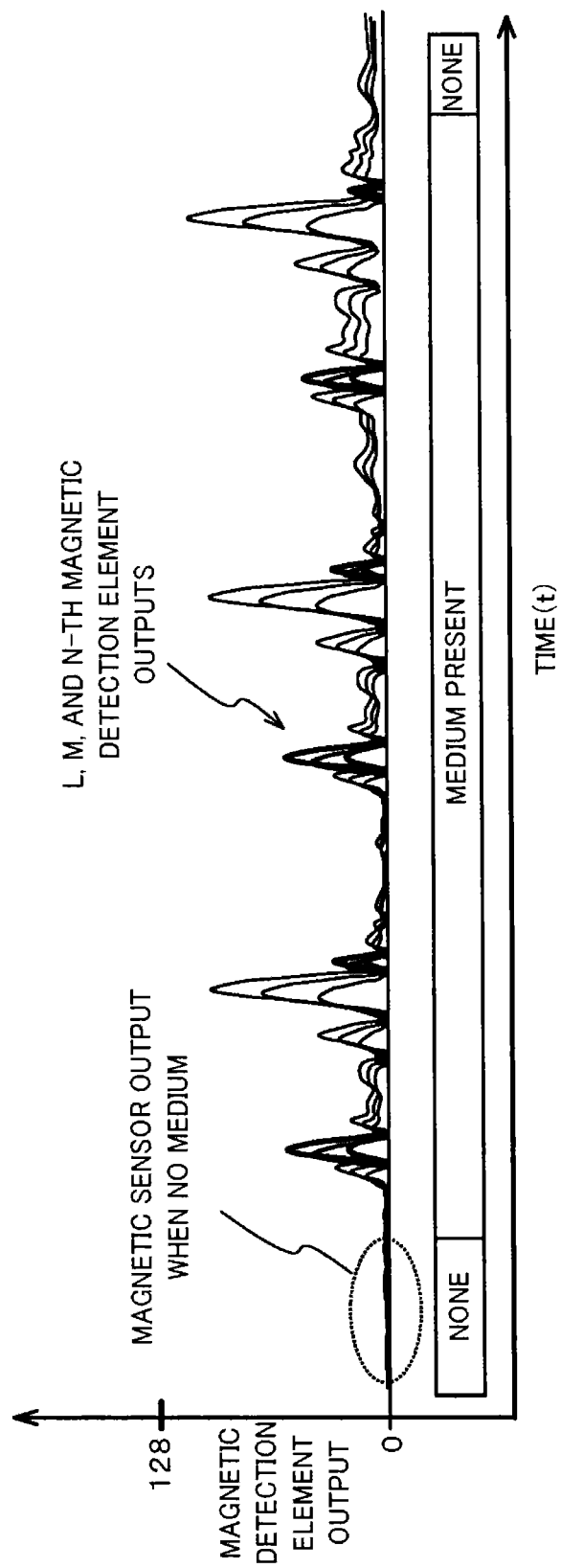
FIG. 13 is an exemplary diagram illustrating an absolute value output from the magnetic detection element.

In FIG. 6, as the magnetic information output, it is proposed a method of outputting magnetic information that is positive/negative signals with reference to the offset reference which is the midpoint of the digital output values. However, the output from the magnetic sensor is not limited to signals that oscillate in positive and negative values with reference to the center of the dynamic range. For example, as illustrated in FIG. 13, a method of setting the "zero" point of the digital output value as a reference, and outputting an output change level based on the reference point (absolute value of a difference between output value and the reference=|output−offset reference value|) may be adopted. By processing in such a way, images can be processed based on only the magnitude of the magnetic information regardless of the sign of the magnetic signal.

Embodiment 3

According to Embodiment 3, while the medium is fed by the same length as the pitch of the adjacent magnetic detection elements 11 along the reading line, the reading cycle is carried out a plurality of times. A time at which the relative moving distance of the medium becomes equal to the pitch of the adjacent magnetic detection elements 11 along the reading line is referred to as a unit feeding time. The first and second embodiments are the cases in which a reading cycle is carried out per a unit feeding time.

According to the magnetic sensor device 10 of Embodiment 1 or 2, the resolution corresponding to the density of the magnetic detection elements 11 can be obtained in the array direction thereof, but the resolution in the feeding direction of the medium depends on the density of the reading cycle. In addition, the output from each magnetic detection element 11 in a single reading cycle is limited to in a time during the reading switch 22 in FIG. 1 is closed. When, for example, the frequency of the clock applied to the shift register 23 is 2 MHz, the output time of the single magnetic detection element 11 per a reading cycle is 0.5 μsec. When the feeding speed is 2 m/sec and the pitch of the magnetic detection elements 11 is 0.5 mm, the unit feeding time is 0.25 msec as explained above. When the clock frequency is 2 MHz, in comparison with a case in which the unit feeding time is 0.25 msec, the output time of the magnetic detection element 11 which is 0.5 μsec is quite short.

That is, the resolution in the feeding direction can resolve only repeated patterns of substantially 2 kHz (resolution of substantially 1 mm) relative to the reading cycle frequency of 4 kHz (the number of reading cycles per a second), and in the case of magnetic patterns that have a larger spatial frequency than the reading cycle frequency, changes in the feeding direction is not picked up in most time periods. In addition, the reading position is shifted by the moving distance of the medium in a single reading cycle since the shift register 23 causes a difference in time for selecting the output of the first element and for selecting the output of the last element.

Figure 14:
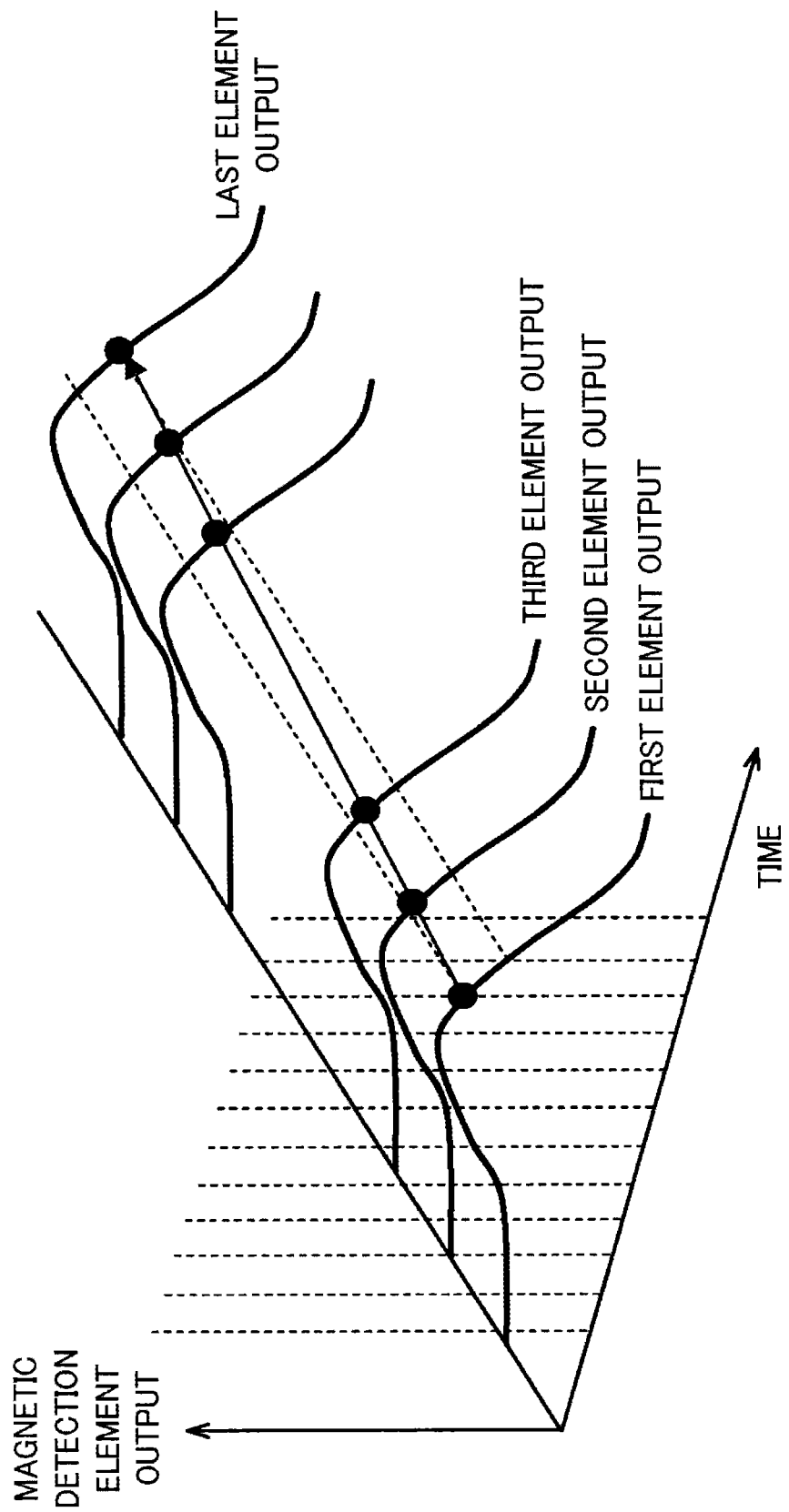
FIG. 14 is a diagram for explaining a difference in output timing for each magnetic detection element.

For example, as illustrated in FIG. 14, when a medium that has a parallel magnetic pattern to the array direction of the magnetic detection elements 11 enters a detection area, assuming that the responses of the respective magnetic detection elements 11 are the same, the output waveforms of the respective magnetic detection elements 11 become the same. When, however, a parallel-serial conversion is performed on the outputs from the magnetic detection elements 11, assuming that the unit feeding time is 0.25 msec, the sampling value of the reading-first magnetic detection element 11 differs from the sampling value of the last magnetic detection element 11 due to the waveform change in a time lag that is 250 μsec at maximum. FIG. 15A is a diagram illustrating an output position of the first element in a line and that of the last element in the line. FIG. 15B is a diagram illustrating an error caused by a difference in output timing. In FIG. 15B, a black dot indicates an output value in a case in which the first in the reading cycle is output, and a star indicates an output value in a case in which the last in the reading line is output. It is shown that, at a location where the magnetic pattern of the medium changes in the feeding direction, there is a difference, which corresponds to a feeding distance in the reading cycle time, between the output from the first position and the output from the last position (see FIG. 15B).

As to the problem in that the reading position of each magnetic detection element 11 in the main scanning shifts in the feeding direction of the medium depending on the position in the reading line, this problem can be solved by disposing the magnetic detection elements 11 being inclined to a direction orthogonal to the feeding direction of the medium. By disposing the magnetic detection elements 11 being inclined to have a difference, which corresponds to the feeding distance of the medium in the reading cycle, between at both ends of the disposition thereof, the shift of the reading position can be solved. That is, the main scanning direction can be aligned so as to be orthogonal to the feeding direction of the medium. However, no improvement is made for the problem in that a change in magnetic pattern within the reading cycles is undetectable. That is, as to an output change within a unit feeding time, the sampling is performed on only the partial value, and as illustrated in FIG. 16, a change in time periods other than the sampling timing is undetectable with respect to the output from each magnetic detection element 11. Hence, magnetic information is not picked up.

Hence, according to Embodiment 3, a plurality of reading cycles is carried out in a unit feeding time. The magnetic sensor device 10 of Embodiment 3 employs the same configuration as that of Embodiment 1. However, the clock frequency to be applied to the shift register 23 is adjusted so as to carry out multiple reading cycles in a unit feeding time. Therefore, multiple pieces of sampling data can be obtained for each magnetic detection element 11 in a unit feeding time.

Figure 17:
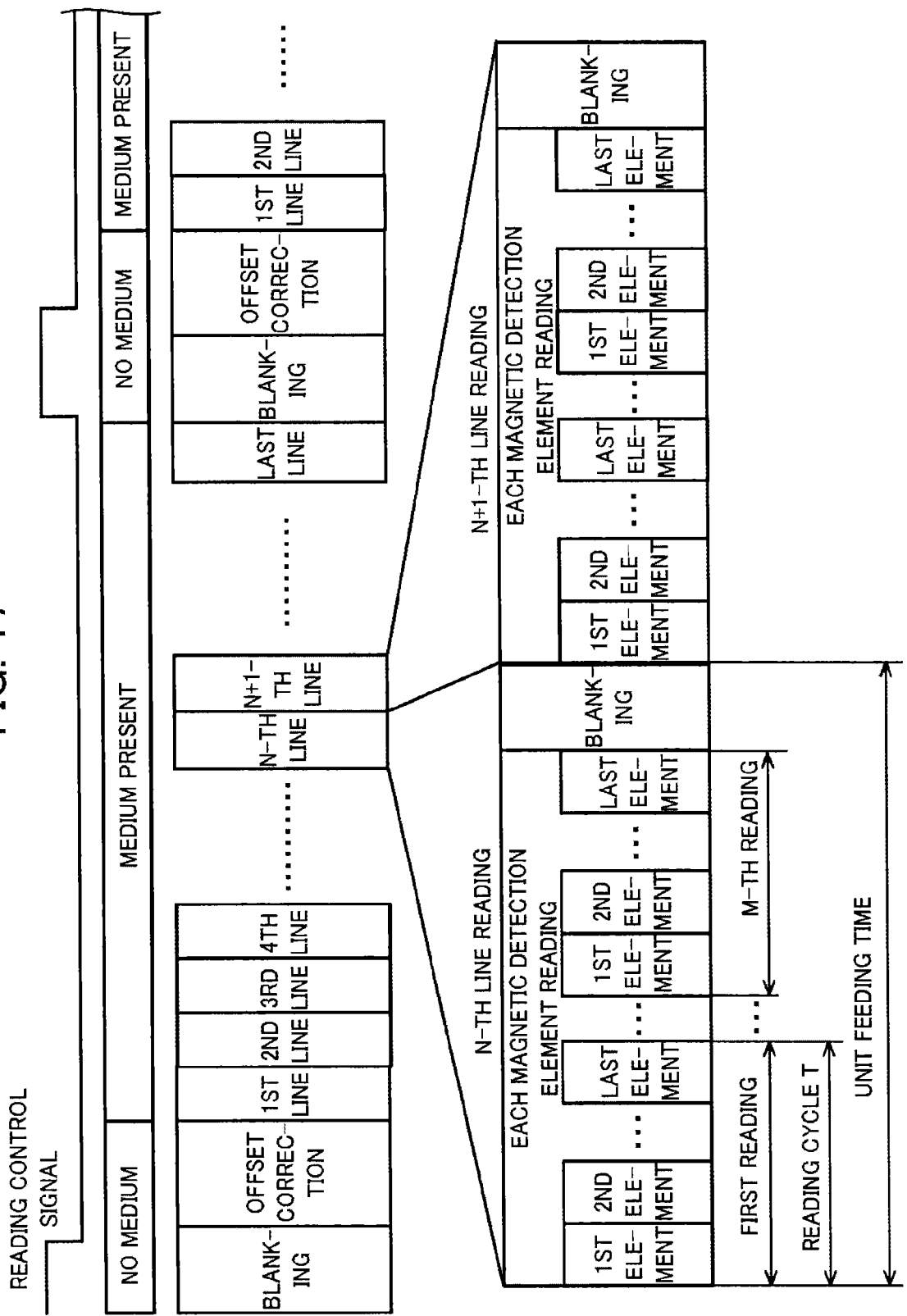
FIG. 17 is a diagram illustrating a reading sequence of magnetic patterns according to Embodiment 3 of the present disclosure.

FIG. 17 is a diagram illustrating a reading sequence of magnetic patterns according to Embodiment 3 of the present disclosure. According to Embodiment 3, the basic operation is the same as that of Embodiment 1, but multiple reading cycles are carried out in a unit feeding time (for example, 0.25 msec). In FIG. 17, a "line" denotes a reading in a unit sub scanning, that is, a unit of sub scanning that has the same distance as a pitch between the magnetic detection elements 11. In FIG. 17, each line (a unit feeding time) includes M-times reading cycles. For example, by applying the clock frequency that is eight times as much as the frequency of carrying out a single reading cycle in a unit feeding time, eight reading cycles are carried out in a unit feeding time.

The ADC 5 in FIG. 3 performs sampling in synchronization with the clock applied to the shift register 23 in a reading cycle. Hence, for each magnetic detection element 11, M pieces of data are obtained in a single unit feeding time. When, for example, eight reading cycles are carried out in a unit feeding time, eight pieces of sampling data are obtained.

According to Embodiment 3, the signal correction processor 8 determines the output value in a unit feeding time based on the outputs of the multiple reading cycles in that unit feeding time. For example, an average value of multiple pieces of data in a unit feeding time, the maximum value, or the minimum value can be output as the output value in a unit feeding time.

Prior to the determination of the output value in a unit feeding time, in order to remove noise components of a higher frequency than the frequency of the reading cycle, a moving average process may be executed. For example, the offset adjuster 7 in the correction circuit 6 in FIG. 4 may execute a moving average process.

Figure 18:
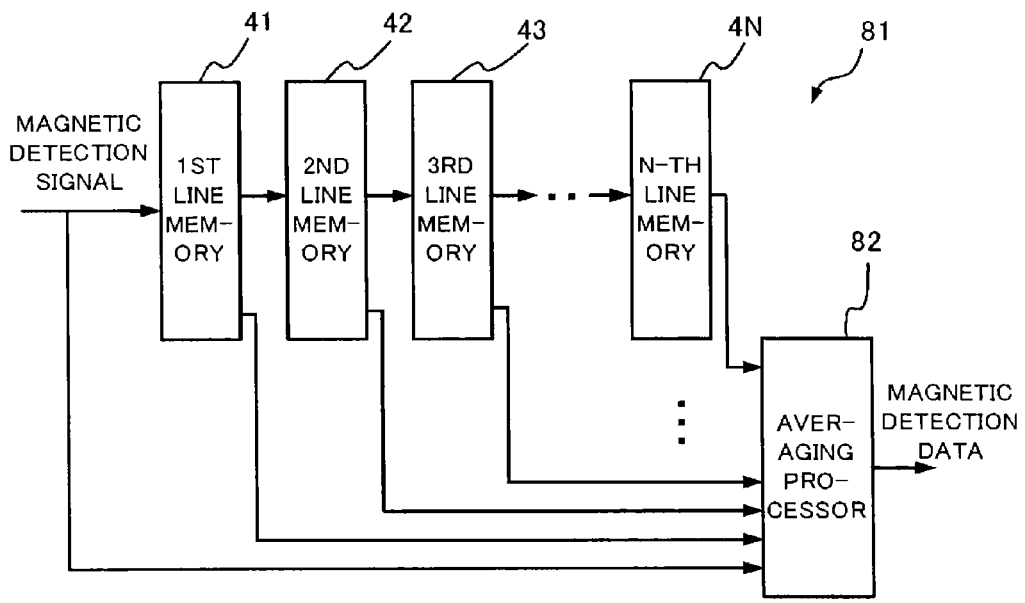
FIG. 18 is a block diagram illustrating an example configuration of a moving average processor.

FIG. 18 is a block diagram illustrating an example configuration of a moving average processor. A moving average processor 81 includes line memories 41, 42, 43, . . . 4N of a number where "1" is subtracted from a number of data to be processed with moving averages and an averaging processor 82. Each of the line memories 41 to 4N stores, not data of a "line" in a single unit feeding time, but data of a single reading cycle. Data sampled by the ADC 5 is stored in the line memory 41 for each reading cycle. The data stored in the line memory 41 is moved to the next line memory 42-4N for each reading cycle. The averaging processor 82 averages pieces of data of the multiple line memories 41-4N and data of the latest reading cycle for each magnetic detection element 11, thereby obtaining moving average data.

Figure 19A:
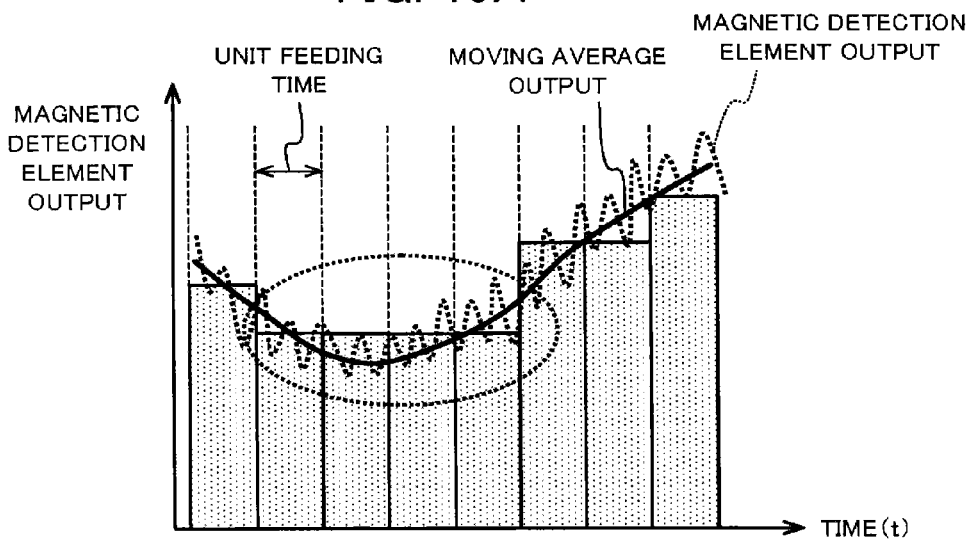
FIG. 19A is a conceptual diagram illustrating noises and a moving average of an output from the magnetic detection element.

FIG. 19A is a conceptual diagram illustrating noises and a moving average of an output from the magnetic detection element. FIG. 19A illustrates a relationship between an output from the magnetic detection element 11 and a moving average output. FIG. 19B is an enlarged diagram of a part encircled by a dotted-line ellipse in FIG. 19A. The output from the magnetic detection element 11 changes at a frequency higher than the frequency of a unit feeding time, while high-frequency components is averaged and smoothed in the moving average output.

Elimination of the noise components in the output from the magnetic detection element 11 is not limited to a simple moving average method. For example, a value expressed by the following formulae can be used. When M-times reading cycles are carried out for each line (a single unit feeding time), for each magnetic detection element 11, with the following parameters:

Dnm: m-th sampling data in n-th line (where m=1 to M);
D'nm: m-th output data of n-th line; and
N: a constant equal to or greater than 1,
when m=1, $D'nm=(Dnm+D'(n-1)M \times N)/(N+1)$, and
when m≥2, $D'nm=(Dnm+D'n(m-1) \times N)/(N+1)$.

That is, the latest output data is a value obtained by dividing the sum of the data of the latest reading cycle and the output data of the previous reading cycle, multiplied by N, by (N+1). The contribution ratio of the data of the latest reading cycle is set to be 1/(N+1) times, and this contribution ratio is reduced sequentially by multiplying N/(N+1), thereby performing a corrected moving average process. The constant N is set in accordance with the spatial frequency characteristics of the magnetic pattern. For example, the constant is set to be a level so that the basic spatial frequency component of the magnetic pattern (in the sub scanning direction) may not be attenuated. According to this corrected moving average method, only the previous output data is stored, and thus the number of reading memories can be merely one. The moving average processor 81 may use other methods, such as a weighted moving average method and an index moving average method (generalized corrected moving average method).

Figure 20:
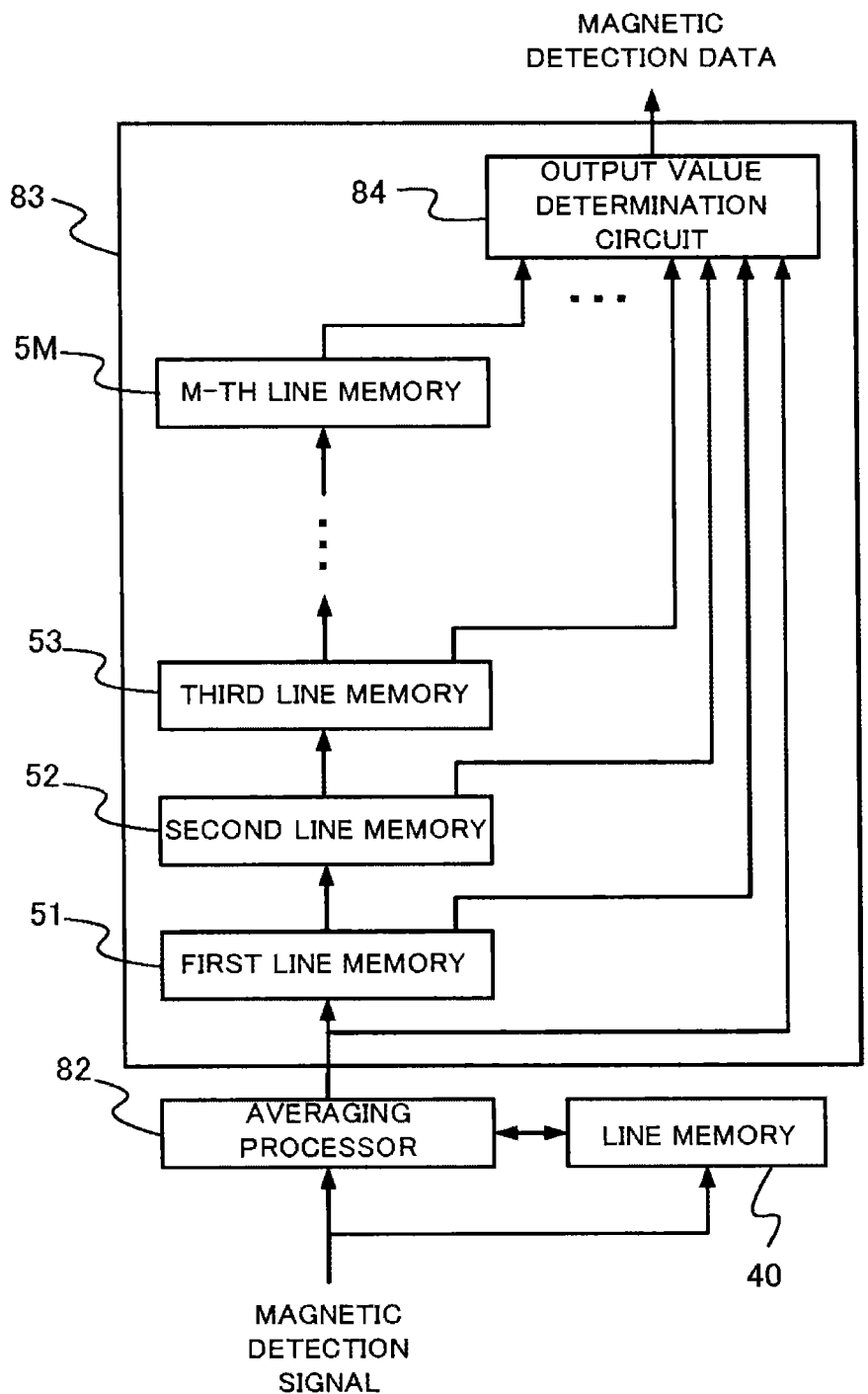
FIG. 20 is a block diagram illustrating an example output arithmetic processor in a signal correction processor.

The signal correction processor 8 calculates output data in a unit feeding time based on M outputs or M moving average outputs in that unit feeding time. FIG. 20 is a block diagram illustrating an example output arithmetic processor in the signal correction processor 8. FIG. 20 illustrates a case in which the averaging processor 82 is employed. In addition, the line memories 41-4N are shown as a line memory 40. The output arithmetic processor 83 includes M number of line memories 51, 52, 53, . . . , 5M, and, an output-value determination circuit 84. The line memories 51-5M each store an output of a single reading cycle or an output of a reading cycle processed by a moving average. Data in the line memory 51 of the output arithmetic processor 83 is moved to the next line memory 52-5M for each reading cycle like the line memory 41 of the moving average method.

Figure 21:
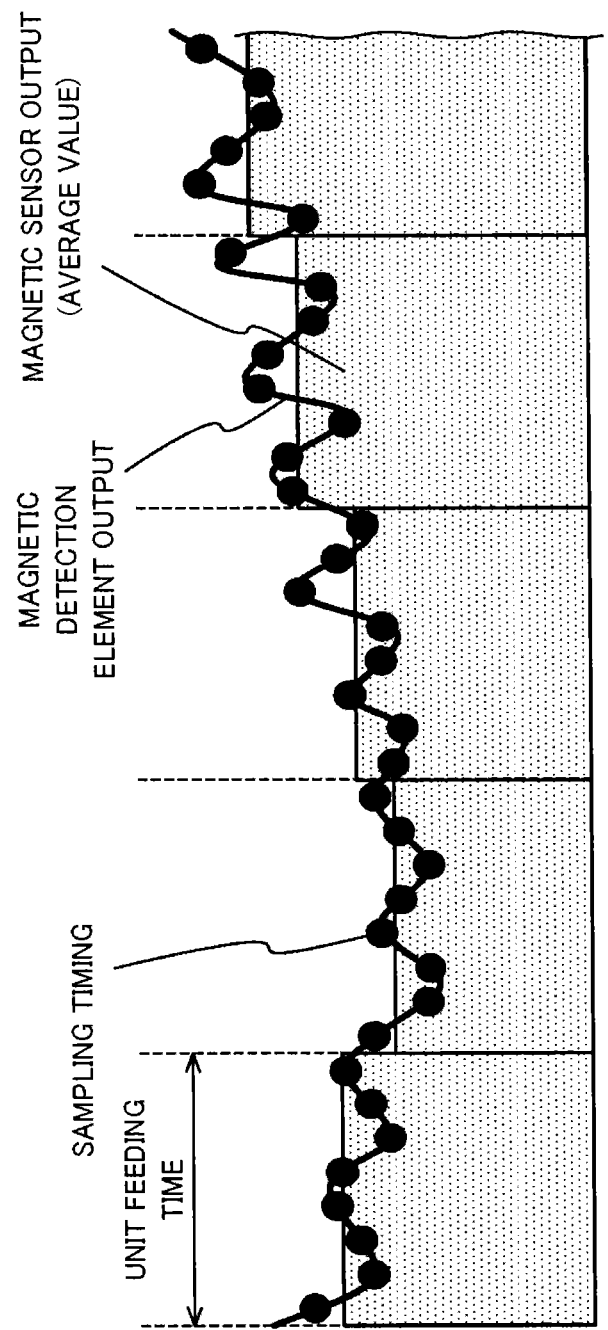
FIG. 21 is a diagram illustrating an output calculation when an average value during a unit feeding time is output.

FIG. 21 is a diagram illustrating an output calculation process when an average value during a unit feeding time is output. The output-value determination circuit 84 of the output arithmetic processor 83 calculates, as output data in a unit feeding time, an average of, for example, M number (eight in FIG. 21) of outputs in that unit feeding time.

Figure 22:
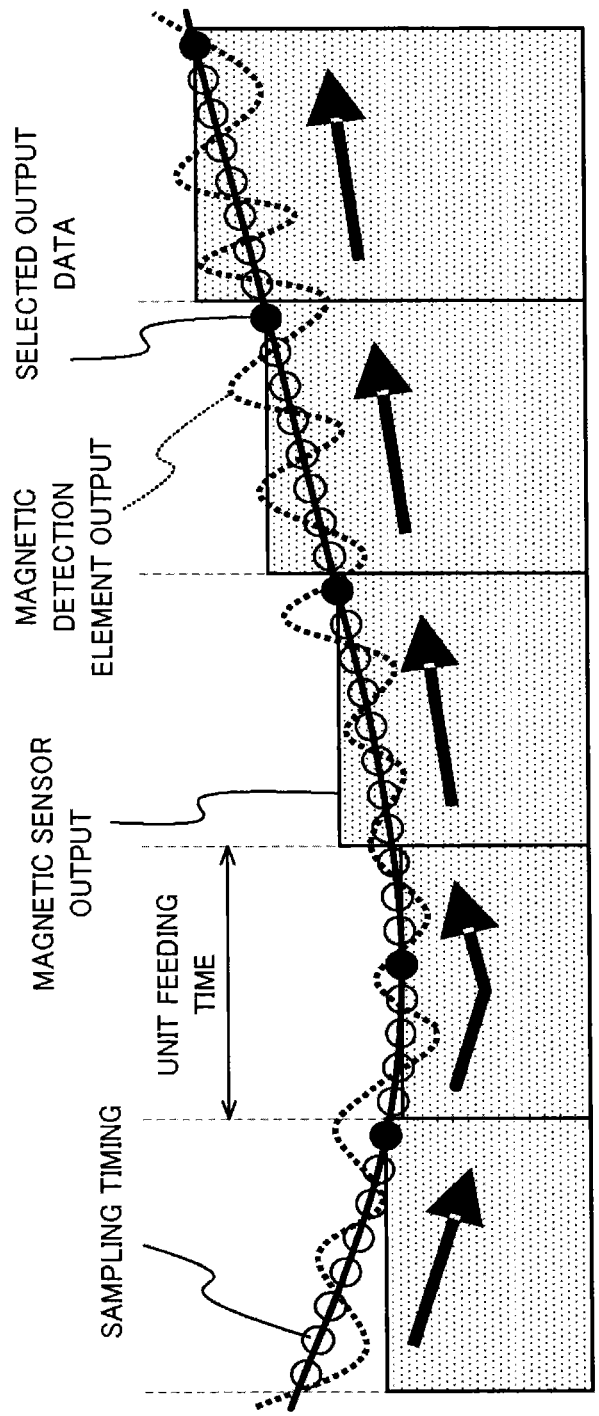
FIG. 22 is a diagram illustrating an example of a different output calculation.

FIG. 22 is a diagram illustrating an example of a different output calculation. In FIG. 22, the value at a sampling timing is indicated by a circle, and a black circle represents output data among the values at sampling timings. Instead of an average value for each unit feeding time, for example, the output-value determination circuit 84 calculates output data through the method as explained below. The explanation is given based on an assumption that M-times reading cycles are carried out in a unit feeding time.

1) When M number of moving average outputs in a single unit feeding time show only an increasing tendency (monotonic increase), the last value (maximum value) of the M number of moving average outputs is output as the output data in that unit feeding time;

2) When the M number of moving average outputs in a single unit feeding time show only a decreasing tendency (monotonic decrease), the last value (minimum value) of the M number of moving average outputs is output as the output data in that unit feeding time; and 3) When the M number of moving average outputs in a single unit feeding time tend to have the local maximum value or the local minimum value, this local value (local maximum or minimum value) is output as the output data in that unit feeding time.

FIG. 22 illustrates a case in which M=8. At the unit feeding time in the left end shown in FIG. 22, since the output shows a monotonic decrease, the last value (minimum value) is calculated as the output data. At the second unit feeding time from the left, since the output has the local minimum value, the local minimum value is calculated as the output. At the other remaining three unit feeding times, since the output shows a monotonic increase, the last value (maximum value) is calculated as the output.

The signal correction processor 8 replaces the output data of the reading clock 2 MHz when a reading cycle is carried out in a unit feeding time with the output data calculated by the output arithmetic processor 83, and outputs the data after being replaced to the processing circuit of the following stage.

Providing any of the means explained above which calculates the output value based on the outputs of the multiple reading cycles, enables the magnetic sensor device 10 to reduce the noise level and to detect the optimized and highly precise magnetic pattern in accordance with the noise level of the magnetic sensor device 10.

An output operation by the magnetic sensor device 10 of Embodiment 3 is basically performed as explained above, but any output arithmetic process may not be executed and the output may be transferred to the following stage process at a clock that carried out multiple reading cycles in a unit feeding time. In this case, a process equivalent to the output arithmetic process may be executed by a device that determines the magnetic pattern, for example, a paper bill authenticity examination/determination device.

According to Embodiment 3, like Embodiment 1 or 2, the signal correction processor 8 can correct the output data with reference to a signal in a blank period without the magnetic pattern. Like Embodiment 1, the signal correction processor 8 can adjust the midpoint of the digital-signal dynamic range so as to have a uniform offset throughout all magnetic detection elements 11. Alternatively, like the modified example of Embodiment 2 (see FIG. 13), a method of outputting an output change level from a reference point (an absolute value of a difference between an output value and a reference=|output−offset reference value|), with reference to the "zero" point of the digital output value may also be used.

Still further, in Embodiment 3, like Embodiment 2, an output selection may be performed. According to Embodiment 3, an output selection is performed for each unit feeding time. In this case, the output selector 61 is provided between the signal correction processor 8 and the output-form converter 9. When the output value is within a threshold range determined from the output value in the previous unit feeding time, the same value as that of the previous unit feeding time is output as the output value of the current unit feeding time. In this case, the stored output of the previous unit feeding time is not updated. When the output is outside of the threshold range determined from the output value of the previous unit feeding time, the output of the current unit feeding time is output as the output value, and the stored output value of the previous unit feeding time is replaced with the output value of the current unit feeding time.

The output-form converter 9 adds, to the magnetic information signal which is output from the signal correction processor 8, signals representing the data output time period of the magnetic information, a synchronous clock, and the break between the detection lines, thereby obtaining an output from the magnetic sensor.

According to the magnetic sensor device 10 of Embodiment 3, execution of the over sampling and the analysis process reduces the amount of magnetic information not picked up due to the parallel-serial process in signal reading, and the displacement of the feature position in the magnetic information. Hence, a high-quality magnetic image can be obtained.

Furthermore, according to Embodiment 3, the effective reading width is not limited to 200 mm, and can be changed to any size. For example, assuming that the shorter side of a paper bill is oriented in the array direction (main scanning direction) of the magnetic detection elements 11, the effective reading width may be set to be substantially 100 mm or smaller.

The present disclosure can be embodied in various ways and can undergo various modifications without departing from the broad spirit and range of the disclosure. Moreover, the embodiment described above is for explaining the present disclosure, and does not limit the range of the present disclosure. In other words, the range of the present disclosure is as set forth in the Claims and not the embodiment. Various changes and modifications that are within the range disclosed in the claims or that are within a range that is equivalent to the claims of the disclosure are also included within the range of the present disclosure.

This application claims a priority based on Japanese Patent Application No. 2012-250933 filed on Nov. 15, 2012 and including the specification, the claims, the drawings, and the abstract. The entire disclosure of Japanese Patent Application No. 2012-250933 are herein incorporated in this specification by reference.

REFERENCE SIGNS LIST

1 Magnetic detection module
2 Signal reading circuit
3 Signal processor
4 Offset amplifier circuit
5 Analog-digital converter (ADC)
6 Correction circuit
7 Offset adjuster
8 Signal correction processor
9 Output-form converter
10 Magnetic sensor device
11 Magnetic detection element
12 Substrate
13 Magnet
14 Magnetic sensor unit
21 Individual reading circuit
22 Reading switch
23 Shift register
24 Data line
25 Clock line
26 Common amplifier circuit
27 Control signal
28 Output line
40, 41, 42, 43, 4N Line memory
51, 52, 53, 5M Line memory
61 Output selector
81 Moving average processor
82 Averaging processor
83 Output arithmetic processor
84 Output-value determination circuit

The invention claimed is:

1. A magnetic sensor device comprising:
a biasing magnet applying a bias magnetic field to a magnetic detection element with a line of magnetic force in a constant direction;
a plurality of the magnetic detection elements configured to detect a magnetic field change caused by passing of a medium with a magnetic pattern through the bias magnetic field as an electric signal and to read the magnetic pattern of the medium, and arrayed along a reading line intersecting with a relative movement direction of the medium;
a plurality of switches, each of the plurality of switches connected to the respective magnetic detection element of the plurality of magnetic detection elements and to a output line common to the plurality of magnetic detection elements; and
a switch controller closing the plurality of switches sequentially one by one to transfer respective outputs from the magnetic detection elements sequentially one by one to the output line;
wherein the switch controller periodically carries out a reading cycle in synchronization with the relative movement of the medium and at a frequency of a unit feeding time that is a time period at which a relative movement distance of the medium becomes equal to a pitch of the adjacent magnetic detection elements along the reading line, the reading cycle being an operation of transferring the outputs of all magnetic detection elements of the plurality of magnetic detection elements one by one to the output line common to the plurality of the magnetic detection elements.

2. The magnetic sensor device according to claim 1, wherein for each magnetic detection element:
when the output is within a threshold range determined from an output value of a previous reading cycle, a same value as the output value of the previous reading cycle is output as an output value of a current reading cycle; and
when the output is outside of the threshold range determined from the output value of the previous reading cycle, the output of the current reading cycle is output as an output value thereof.

3. The magnetic sensor device according to claim 1, wherein the switch controller:
carries out a plurality of the reading cycle within the unit feeding time; and
includes an output arithmetic processor that determines, for each magnetic detection element, an output value in the unit feeding time based on outputs of the plurality of the reading cycles in the unit feeding time.

4. The magnetic sensor device according to claim 3, wherein the output arithmetic processor outputs an average value of the outputs of the plurality of the reading cycles in the unit feeding time as an output value in the unit feeding time.

5. The magnetic sensor device according to claim 3, wherein when the outputs of the plurality of the reading cycles in the unit feeding time:
increases monotonically, the output arithmetic processor outputs a maximum value of the outputs in the unit feeding time as an output value in the unit feeding time;
decreases monotonically, the output arithmetic processor outputs a minimum value of the outputs in the unit feeding time as the output value in the unit feeding time; and
contains a local maximum value or a local minimum value, the output arithmetic processor outputs the local maximum value or the local minimum value in the unit feeding time as the output value in the unit feeding time.

6. The magnetic sensor device according to claim 5, wherein the output arithmetic processor calculates the output value by replacing an output of the reading cycle with a latest moving average of the reading cycle for each magnetic detection element.

7. The magnetic sensor device according to claim 3, wherein the output arithmetic processor:
calculates an average value of the outputs of the plurality of the reading cycles in the unit feeding time;
outputs the average value as an output value in the unit feeding time when all outputs of the plurality of the reading cycles in the unit feeding time are within a predetermined range relative to the average value; and
outputs an output having a most apart value from the average value as the output value in the unit feeding time when among the outputs of the plurality of the reading cycles in the unit feeding time there exists an output data being outside of the predetermined range relative to the average value.

8. The magnetic sensor device according to claim 3, wherein the output arithmetic processor:
outputs the output value in the previous unit feeding time as an output value in the unit feeding time when all outputs of the plurality of the reading cycles in the current unit feeding time are within a predetermined range from the output value in the previous unit feeding time; and
outputs an output having a most apart value from the output value in the previous unit feeding time as the output value in the unit feeding time when among the outputs of the plurality of the reading cycles in the unit feeding time there exists an output being outside of the predetermined range relative to the output value in the previous unit feeding time.

9. The magnetic sensor device according to claim 1, further comprising an output adjuster determining a center value of an output value range to be an output value of the magnetic detection element when there is no magnetic pattern at a reading position of the magnetic detection element and adjusting an output value of the magnetic detection element to a positive or negative value around the center value.

10. The magnetic sensor device according to claim 1, further comprising an output adjuster determining a reference to be an offset voltage of an output from the magnetic detection element, and outputting an absolute value of a difference between an output value of the magnetic detection element and the reference as the output value of the magnetic detection element.

11. A magnetic sensor device, comprising:
a biasing magnet applying a bias magnetic field to a magnetic detection element with a line of magnetic force in a constant direction;
a plurality of the magnetic detection elements configured to detect a magnetic field change caused by passing of a medium with a magnetic pattern through the bias magnetic field as an electric signal and to read the magnetic pattern of the medium, and arrayed along a reading line intersecting with a relative movement direction of the medium;
a plurality of switches, each of the plurality of switches connected to the respective magnetic detection element of the plurality of magnetic detection elements and to a output line common to the plurality of magnetic detection elements; and
a switch controller closing the plurality of switches sequentially one by one to transfer respective outputs from the magnetic detection elements sequentially one by one to the output line;
wherein the switch controller periodically carries out a reading cycle in synchronization with the relative movement of the medium, the reading cycle being an operation of transferring the outputs of all magnetic detection elements of the plurality of magnetic detection elements one by one to the output line common to the plurality of the magnetic detection elements; and
for each magnetic detection element:
when the output is within a threshold range determined from an output value of a previous reading cycle, a same value as the output value of the previous reading cycle is output as an output value of a current reading cycle; and
when the output is outside of the threshold range determined from the output value of the previous reading cycle, the output of the current reading cycle is output as an output value thereof.

12. The magnetic sensor device according to claim 11, further comprising an output adjuster determining a center value of an output value range to be an output value of the magnetic detection element when there is no magnetic pattern at a reading position of the magnetic detection element and adjusting an output value of the magnetic detection element to a positive or negative value around the center value.

13. The magnetic sensor device according to claim 11, further comprising an output adjuster determining a reference to be an offset voltage of an output from the magnetic detection element, and outputting an absolute value of a difference between an output value of the magnetic detection element and the reference as the output value of the magnetic detection element.

* * * * *